United States Patent
Lackey

(10) Patent No.: US 6,187,379 B1
(45) Date of Patent: *Feb. 13, 2001

(54) FLUIDIZED BED COATING PROCESS WITH LIQUID REAGENT

(75) Inventor: Walter J. Lackey, Marietta, GA (US)

(73) Assignee: Georgia Tech Research Corporation, Atlanta, GA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/835,584

(22) Filed: Apr. 9, 1997

Related U.S. Application Data

(60) Provisional application No. 60/016,297, filed on Apr. 12, 1996.

(51) Int. Cl.[7] ................................................. C23C 16/00
(52) U.S. Cl. ..................... 427/248.1; 427/591; 427/595; 427/900; 427/901
(58) Field of Search .............................. 427/248.1, 252, 427/253, 432, 591, 595, 900, 901

(56) References Cited

U.S. PATENT DOCUMENTS

| | | |
|---|---|---|
| 3,565,037 | 2/1971 | Walling . |
| 3,850,689 | 11/1974 | Basche et al. . |
| 3,940,514 | 2/1976 | Baker et al. . |
| 3,984,587 * | 10/1976 | Lipp ...................................... 427/255 |
| 4,265,982 * | 5/1981 | McCreary et al. ................... 427/245 |
| 4,472,454 | 9/1984 | Houdayer et al. . |
| 4,749,595 | 6/1988 | Honda et al. . |
| 4,954,365 * | 9/1990 | Neifeld ............................... 427/430.1 |
| 5,171,734 * | 12/1992 | Sanjuro et al. ..................... 427/255.2 |
| 5,258,132 | 11/1993 | Kamel et al. . |
| 5,389,152 | 2/1995 | Thurston et al. . |
| 5,397,595 * | 3/1995 | Carroll et al. ..................... 427/249.4 |
| 5,547,717 * | 8/1996 | Scaringella et al. .............. 427/249.1 |
| 5,552,181 * | 9/1996 | Kondoh et al. ....................... 427/250 |

* cited by examiner

Primary Examiner—Shrive Beck
Assistant Examiner—Bret Chen
(74) Attorney, Agent, or Firm—Thomas, Kayden, Horstemeyer & Risley, L.L.P.

(57) ABSTRACT

A preferred embodiment of a method for coating a substrate with a chemical compound uses a precursor liquid. This precursor liquid preferably serves as a reagent in the coating process and is housed in a reactor. Once the precursor liquid is placed in the reactor, the substrate is immersed in the precursor liquid. While the substrate is immersed in the precursor liquid, which may or may not contain solid particles, the liquid is fluidized by one or more possible methods: passing a gas through the liquid; recirculating the liquid; and stirring the liquid. In the preferred embodiment, inductive heating of the substrate is performed by an induction coil. The induction coil will be driven by a generator to emit a high frequency alternating current electromagnetic field such that only the substrate is directly heated. Heating the substrate in a fluidized bed will cause chemical vapor deposition or chemical vapor infiltration to occur and the desired chemical compound, or element, to be deposited on the substrate. The compound that coats the substrate may be either the vaporized precursor liquid, a gas injected into the reactor, or some combination of the two.

26 Claims, 1 Drawing Sheet

FLUIDIZED BED COATING PROCESS WITH LIQUID REAGENT

RELATED APPLICATION

This application is based upon, and claims priority to prior-filed provisional application Ser. No. 60/016,297; filed Apr. 12, 1996.

FIELD OF THE INVENTION

The present invention relates generally to a method for coating various substrates and, more particularly, to a method for coating particles or components by using a fluidized bed having a liquid reagent.

BACKGROUND OF THE INVENTION

Fluidized bed coating processes are used to deposit carbon (C), silicon (Si), siliconcarbide (SiC), and other ceramics and metals onto particles and components used in low observable and medical applications, for example. The fluidized bed typically is a bed of particles that are lifted and agitated by a rising stream of a process gas. At low velocities, the amount of lifting is slight and the bed behaves as a boiling liquid, hence the term fluidized bed. The bed is typically contained within a furnace, or reactor heated inductively, resistively, or otherwise.

In chemical vapor deposition (CVD) at least a part of the gas used to fluidize the bed is a reactive gas that break downs when it contacts the heated particles into coating materials such as carbon, silicon or silicon carbide. Often times, for example, methane is used, perhaps along with argon as a carrier. The term chemical vapor infiltration, or CVI, is used when the particles or articles being coated are not merely surface coated, but the reagent enters into the porous substrate and is deposited therein.

In the above described conventional fluidized bed, the entire bed and vessel are hot. Thus, the interior surface of the vessel, which is commonly made out of graphite, as well as the particles, will become coated by the reagent. As such, the vessel and the particles must be frequently replaced.

Some work has been done in the past using liquid reagents with CVD or CVI processes to achieve coating of filaments and infiltration of porous preforms. For example, U.S. Pat. No. 3,850,689 to Basche et al. teaches a process to deposit silicon carbide on filaments by passing the hot filament through a liquid organo silicon halide, wherein the temperature of the hot surface is high enough to cause the organo silicon halide immediately surrounding the hot surface to film boil, decompose, and deposit a silicon carbide coating on the filament. Two other U.S. Pat. No. 5,389,152 to Thurston et al. and U.S. Pat. No. 4,472,454 to Houdayer et al., teach processes for the densification of a porous preform that involve immersing a conductive preform in a liquid hydrocarbon or other precursor liquid. An induction coil is used to heat the preform so that the precursor liquid immediately surrounding the preform decomposes and carbon, or another element, is infiltrated into the preform. These processes are taught using a stationary preform.

Thus, there exists a need in the art for a coating method using chemical vapor deposition or chemical vapor infiltration from a fluidized bed in order to quickly, economically, and completely coat a substrate.

SUMMARY OF THE INVENTION

An object of the present inventive method is to permit coating of a substrate by means of chemical vapor infiltration or chemical vapor deposition using a fluidized bed with a liquid reagent.

Another object of the present invention is to provide a coating method that permits the substrate, or preform, to freely move about in a liquid reagent in order to more fully and evenly coat the substrate.

An additional object of the present invention is for a coating method which only coats the conductive particles/objects and avoids coating nonconductive reactor walls and other nonconductive particles in a liquid reagent.

Briefly described, a preferred embodiment of a method for coating a substrate with a chemical compound using a fluidized bed comprises, initially, a precursor liquid. This precursor liquid serves as a reagent in the chemical vapor deposition or chemical vapor infiltration process and is housed in a furnace, or reactor.

Once the precursor liquid is placed in the reactor, the substrate, whether particles or articles to be coated, should be preferably immersed in the precursor liquid. In the preferred embodiment, the substrate is permitted to freely circulate within this liquid. However, it would be possible to suspend the substrate in the liquid from a securing device such that the substrate will not freely circulate within the liquid.

While the substrate is immersed in the precursor liquid, a non-reactive, preferably inert, gas is passed through a gas injector in the bottom of the reactor. This non-reactive gas bubbles up through the liquid and aids in fluidization of the bed. Fluidization may also be augmented by placing non-reactive, non-conducting particles within the liquid. Particles such as glass or ceramic beads would be appropriate and would aid in fludizing the bed.

In the preferred embodiment, inductive heating of the substrate is performed by an induction coil placed directly adjacent to the exterior of the reactor walls. Alternatively, the induction coil can be placed inside the reactor, within the precursor liquid. In either aspect, the induction coil will be driven by a generator to emit a high frequency alternating current such that only the substrate to be coated will be heated. Of course, other devices for heating the substrate may be used with equal effectiveness. For example, the substrate may be heated by resistive heating, microwave heating, or even a laser. When the substrate is heated to high enough level, chemical vapor deposition or chemical vapor infiltration occurs and the desired chemical compound is deposited on the substrate.

In another aspect of the present invention, the liquid in the reactor may be inert and the gas may be the reactive compound in the process. Alternatively, the liquid in the reactor and the gas bubbled through the liquid may react in some manner to cause a compound, or element, to be deposited onto the substrate by either chemical vapor deposition or chemical vapor infiltration.

In an alternative embodiment of the present invention, the reactor unit is adapted to recirculate the precursor liquid in order to aid in fluidization of the bed. In fact, recirculation of the precursor liquid can comprise the primary means of fluidization. In this way, injecting a gas into the reactor is no longer necessary to this alternative embodiment of the present invention.

As an improvement to the preferred embodiments, the vapor escaping from the fluidized bed may be recaptured by a reflux condensor or other appropriate vapor recapturing device. Alternatively, or additionally, a stirring device, such as an auger or propeller, may be placed within the precursor liquid in order to agitate the liquid and more evenly coat the substrate.

An advantage of the present invention is that the method described herein permits use of an auger or other stirring device to agitate the liquid reagent and the substrate. This gives a more thorough coating of the substrate in a lesser time.

Another advantage of the present invention is that sticking of substrates together or to the fluidizing media is reduced or eliminated since only the conducting components are being coated. This means that more substrates may be coated at one time.

An additional advantage of the present invention is that the liquid reagent yields faster deposition rates as compared to gas fluidized beds.

Another advantage of the invention is that coating of both larger and smaller substrates may be possible as compared to a gas fluidized bed. For example, small particles would be less likely to be expelled from a liquid fluidized bed since they are "wetted" and since the gas flow (if any) required for fluidization is reduced.

Yet another advantage of the present invention is that a continuous coating process is possible since the reactor walls and the nonconductive fluidizing media are not coated, or coated to a much lesser extent than involved in prior art fluidized bed depositions.

Another advantage of the present invention is that a variety of gas injectors can be used. Design of a gas injector for the novel method described herein will be less complex since the liquid reagent will assist in suspending the substrate particles or articles and any nonreactive fluidizing particles.

Other objects, features, and advantages of the present invention will be apparent to those skilled in the art. A more thorough understanding of the invention will be gained through a review of the detailed description set forth below, when taken in conjunction with the accompanying drawing, which is briefly described as follows.

BRIEF DESCRIPTION OF THE DRAWINGS

The present invention can be better understood with reference to the following drawing. The drawing is not necessarily to scale, emphasis instead being placed upon clearly illustrating principles of the present invention.

DETAILED DESCRIPTION OF THE INVENTION

Figure 1:
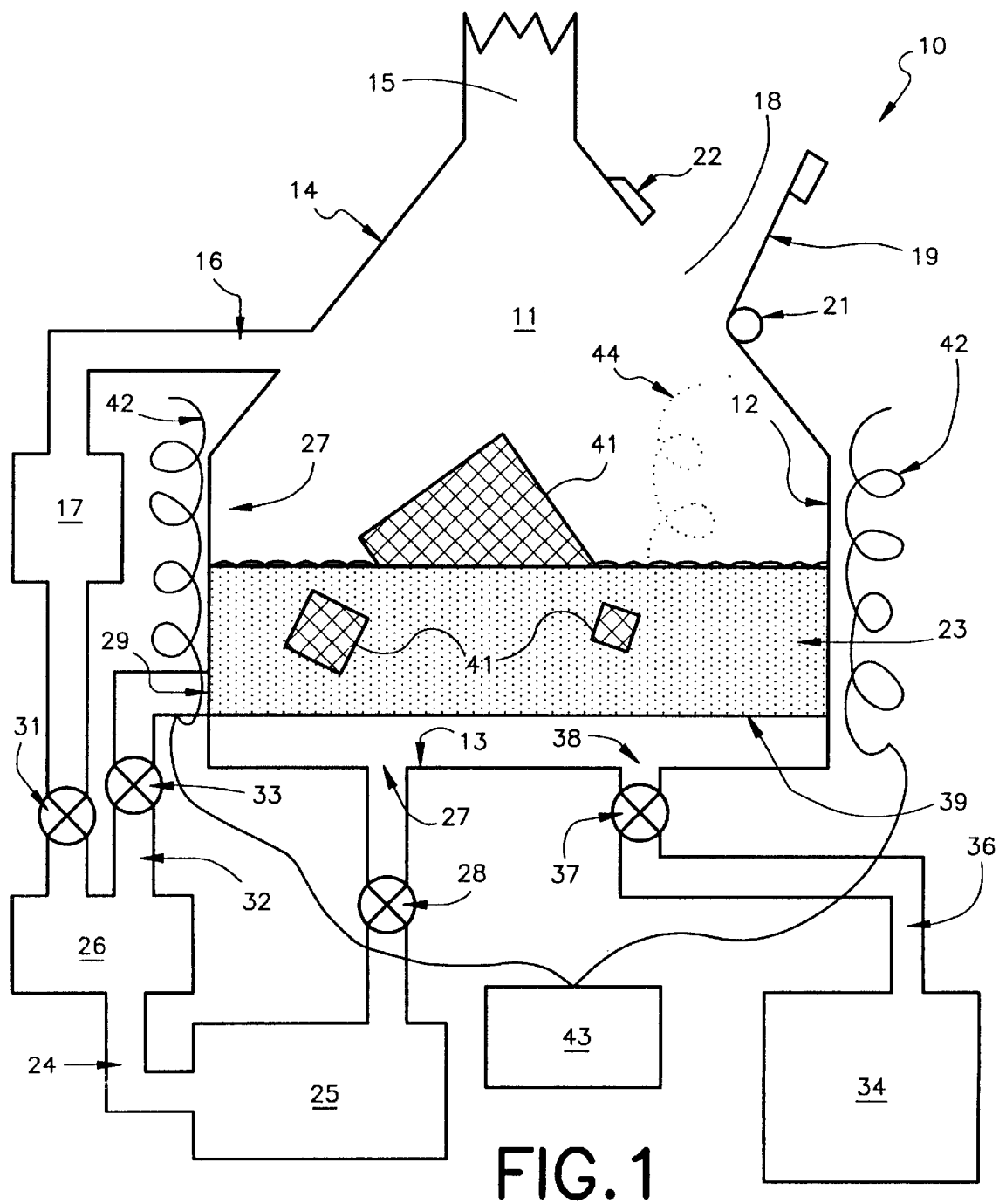
FIG. 1 is a schematic diagram of the preferred embodiment of a fluidized bed apparatus for performing the novel method disclosed herein.

The present invention involves a process for coating conductive substrates, such as particles and/or articles, using chemical vapor deposition (CVD) or chemical vapor infiltration (CVI) wherein the particles or articles preferably freely circulate in a fluidized bed that includes a liquid.

The basic apparatus 10 used to practice the preferred embodiment of the present inventive method is depicted in FIG. 1. Although a particular type of apparatus is depicted and described herein, the present invention is not intended to be limited to use with an apparatus containing only the features described. In fact, many different apparatuses for practicing the present invention are usable and will be recognized as such by those with skill in the art.

The apparatus 10 preferably comprises a reactor 11 having walls 12. Preferably, although not limited to such a configuration, the reactor 11 will have walls 12 forming a vertically tubular cavity having a circular, substantially planar floor 13 and a tapered upper neck 14. The tapered neck 14 reduces to a small diameter top outlet 15, which serves as a vent for the system. A return pipe 16 interfaces along one portion of the tapered neck 14. The return pipe 16 connects to a reflux condensor 17. The reflux condensor 17 will be discussed additionally below.

The reactor walls 12 preferably have an interior face constructed of glass, ceramic, or some other suitable non-conductive material. Non-conductive will prevent reactive elements from coating the walls 12 of the reactor 11 during operation of the present invention.

A portion of the reactor walls 12 defines a large opening 18, preferably near the upper neck 14. This opening 18 is preferably used for the insertion and/or removal of substrates to be coated by the novel method disclosed herein. The size and shape of the opening 18 will depend on the particular application of the present invention and the particular substrates to be coated. One with skill in the art will be able to suitably size the opening 18.

Preferably, the opening 18 is usually covered by a hinged door structure 19. The hinges 21 attach the door 19 to the reactor walls 12. Further, a latch 22 secures the door 19 to the reactor walls 12 when the door 19 is closed. However, the door 19 may be attached by unshaped channels serving as tracks (not shown) such that the door 19 may be slidably adjusted to cover and uncover the opening 18. In any event, the door 19 seals the opening 18 with an airtight seal.

As indicated above, the primary purpose of the reactor 11 is to house a precursor liquid reagent 23 to be fluidized into a fluidized bed for conducting CVD or CVI on a substrate placed in the liquid 23. In the first preferred embodiment of the present invention, the liquid 23 is a reactive reagent. For example, the liquid 23 may be hexane or methyltrichlorosilane. The liquid 23 may further include nonreactive and nonconductive particles (not depicted) to assist in forming a fluidized bed. These particles, if utilized, typically comprise ceramic or glass material. As such, these particles 24 are nonconductive.

Piping 24 connects a liquid storage tank 26 to a pump 25 for forcing liquid through a fluid inlet 27 attached to the reactor 11. The flow of liquid 23 through the piping 24 is controlled, preferably, by a gate valve 28 placed near the inlet 27. Near the floor 13 of the reactor 11, a fluid outlet 29 permits fluid to drain out of the reactor 11. The outlet 29 is preferably attached and connected to the liquid storage tank 26. Preferably, the flow of liquid 23 out of the reactor 11 and through the piping 32 is controlled by another gate valve 33. This outlet 29 permits the liquid 23 to be drained from the reactor 11 for any reason desired, such as to clean the interior reactor walls 12.

As an option, a recirculation system to circulate liquid 23 through an external system in order to keep the liquid 23 "fluidized" could be employed and is depicted in FIG. 1. Note that the liquid 23 may be pulled from the storage tank 26 by the pump 25 and forced into the reactor 11. Meanwhile, the pump 25 also causes liquid 23 to be pulled out of the reactor 11, through the outlet 29, and into the storage tank 26. Cooling or heating may also be provided to the circulated liquid 23 while in the storage tank 26.

In the first preferred embodiment, a gas stream is employed to assist in fluidization of the bed, or to induce chemical reaction within the bed. In this first preferred embodiment, the gas comprises an inert, or substantially inert gas. Gases such as Argon, Neon, Xenon, Helium, and Nitrogen would be appropriate for use in the first preferred embodiment. On the other hand, some applications of the preferred embodiment may require a reducing gas such as hydrogen. Which ever gas is used, the gas is preferably housed in a supply device 34 and carried to the reactor 11 by piping 36. A gate valve 37 controls the gas flow. The gas is injected into the reactor 11 through an opening 38 in a bottom portion of the reactor 11. In this embodiment, there is preferably a gas injector 39. Various types of gas injectors (cones, porous plates, etc.) could be used as they are in any solid fluidized bed coating process. A porous plate gas injector 39 is depicted in FIG. 1; however, many types of gas injectors are usable with the present invention. In any case, the gas will bubble up through the liquid 23 and aid in stirring and fluidizing the liquid 23.

The use of such an inert gas, to aid in fluidization, is not necessary to the present invention. A stir bar (not depicted), such as an auger, can be used inside the reactor 11 to keep the fluid 23 circulating. An appropriate stirring device would be preferably constructed of a nonconductive material and may be cooled or heated by an internal temperature control/heat transfer system. As an alternative embodiment, the liquid recirculation procedure described above can be adequate to fluidize the bed in the absence of any gas and/or any other stirring device.

As another alternative embodiment of the present invention, the liquid 23 may comprise an inert carrier liquid and a gas passing through the liquid can be a reactive coating gas. Alternatively, a portion or all of the fluidizing gas might react with the vapor of the liquid and provide a material that is deposited on a substrate. For example, a liquid such as $SiCl_4$, might provide Si while a gas such as a hydrocarbon, nitrogen, or ammonia might provide C or N so that SiC or silicon nitride is deposited on the substrate.

With the bed fluidized, whether the reactive agent is the liquid, gas, or both, a substrate 41 to be coated is immersed in the liquid 23. The substrate 41 will preferably be comprised of a conductive material; however, the substrate 41 does not have to be metallic. The invention is applicable for coating metals, carbon materials, or nuclear fuel particles. The invention is also useful for coating particles for low observable applications, abrasives, or articles such as heart valve components. The size of the substrate 41 is not strictly defined but can be any sufficient size such that it will remain in the liquid fluidized bed and not be carried off by vapors formed in the process. Also, the article 41 should not be so large that it will not be suspended or circulate in the liquid fluidized bed. Further, the particles or articles 41 are preferably stable at the high temperatures required to achieve decomposition of the liquid reagent 23.

Although the substrate 41 is preferably allowed to freely circulate in the liquid reagent 23, a supporting mechanism (not depicted) may be used if desired, or needed. Typically, this will include a holding apparatus for claiming the substrate on one end and attaching to the reactor walls 12 on the opposing end.

Once the substrate 41 is immersed in the liquid 23, it is necessary to have some method of heating the substrate 41 to be coated. In the preferred embodiment, an induction coil 42 is wrapped around the outside of the reactor 11. This induction coil 42 is powered by an electrical generator 43 such that the coil 42 emits a high frequency alternating current. Alternatively, a similar induction coil 44 may be placed inside the reactor 11 such that the coil 44 contacts the fluid 23 in the reactor 11. A similar generator 43 will also operate the interior induction coil 44 at a high frequency alternating current. Because the induction coil 42 and 44 emits a high frequency electromagnetic field, only conductive materials will be heated.

Notice that since the reactor walls 12 and any mixing particles in the 23 fluid are preferably non-conducting, they will not be heated by the coil 42, 44 of the preferred embodiment. Additionally, because liquid is a poor conductor, even though heat will radiate from the substrate 41, the reactor walls 12 will not readily be heated. In an alternative embodiment of the apparatus, microwave or laser heating of the substrate 41 is possible.

The substrate 41 is heated to a temperature sufficient to decompose the precursor liquid 23 and deposit the desired chemical on the substrate 41. Typically, the appropriate temperature is between 300° C. and 1500° C. At this temperature, chemical vapor deposition (or chemical vapor infiltration) begins at the surface of the substrate 41.

As mentioned above, the apparatus preferably includes a mechanism permitting vapors to escape the reactor 11. Although a vent 15 is provided, the preferred embodiment also includes a vapor recovery system. The vapor recovery system preferably comprises the aforementioned return pipe 16 connecting the reactor 11 with a reflux condensor 17, or other appropriate device employing a condensing coil. In this system, vapor is routed from the reactor 11 to the condensor 17, where the liquid 23 is recovered. The liquid 23 is then routed through a gate valve 31 and back into the liquid storage tank 26.

A continuous coating process is possible with the present invention because the reactor walls 12 and any nonconductive fluidizing media are not coated (or receive only slight coating compared to the conducting substrates 41). Substrates 41 to be coated could be continuously, or periodically, removed and new substrates 41 added without halting operation of the CVD or CVI process.

What is claimed is:

1. A method for coating a conductive substrate with a chemical compound or element, said method comprising the steps of:

(a) providing a precursor liquid housed in a reactor, said liquid forming a liquid bed for the conductive substrate;

(b) immersing the conductive substrate in said liquid bed;

(c) passing a stream of gas though an opening in said reactor such that said gas stream passes through said liquid, said gas stream fluidizing said liquid bed to put said liquid bed into a turbulent state;

(d) providing a means for heating conductive materials; and (e) heating the conductive substrate directly with said heating means to a temperature sufficient to vaporize said precursor liquid to form a vaporized material; and (f) raising a temperature of the vaporized material so that the vaporized material decomposes in the vicinity of the substrate and deposits a solid coating on the substrate.

2. The method of claim 1, further comprising the step of placing nonreactive, nonconductive particles in said precursor liquid for facilitating fluidization and mixing of the liquid bed.

3. The method of claim 1, wherein said heating means comprises an induction coil, said induction coil immersed in said precursor liquid.

4. The method of claim 1, wherein said heating means comprises an induction coil, said induction coil surrounding said reactor.

5. The method of claim 1, wherein said reactor comprises a non-conducting material.

6. The method of claim 1, further comprising the step of agitating said liquid bed with a stirring device in order to enhance fluidization of said liquid bed, said stirring device comprising a nonconductive material.

7. The method of claim 1, further comprising the step of recapturing a vapor rising from said precursor liquid.

8. The method of claim 1, wherein the substrate is unrestrained within said precursor liquid with respect to means for heating the substrate.

9. The method of claim 1, wherein the coating of the substrate occurs by chemical vapor deposition.

10. The method of claim 1, wherein the coating of the substrate occurs by chemical vapor infiltration.

11. The method of claim 1, further comprising the step of recirculating said liquid in order to enhance fluidization of said liquid bed.

12. A method for coating a conductive substrate with a vapor phase chemical compound, said method comprising the steps of:
   (a) providing a non-reactive liquid housed in a reactor, said liquid forming a liquid bed to be fluidized;
   (b) immersing the substrate in said liquid bed;
   (c) passing a stream of reactive gas through an injector in said reactor, said gas stream passing through and fluidizing said liquid bed to put said liquid bed into a turbulent state; and
   (d) heating the conductive substrate with a means for directly heating said substrate to a temperature sufficient to decompose said reactive gas in the vicinity of the substrate and deposit a solid coating on the substrate.

13. The method of claim 12, further comprising the step of placing non-reactive particles in said liquid for facilitating fluidization of said liquid bed, and therefore fluidization of said liquid bed.

14. The method of claim 12, wherein the step of heating the conductive substrate comprises operating an induction coil surrounding said reactor to emit electromagnetic radiation.

15. The method of claim 12, wherein the substrate is unrestrained within said precursor liquid medium with respect to said reactor.

16. A method for coating a conductive substrate with a chemical compound or element, said method comprising the steps of:
   (a) providing a precursor liquid housed in a reactor, said liquid forming a liquid bed for the conductive substrate;
   (b) immersing the conductive substrate in said liquid bed;
   (c) passing a stream of reactive gas though an opening in said reactor such that said gas stream passes through said liquid, said gas stream fluidizing said liquid bed to put said liquid bed into a turbulent state;
   (d) providing a means for heating conductive materials; and
   (e) heating the conductive substrate directly with said heating means to a temperature sufficient to vaporize said precursor liquid to form a vaporized material;
   (f) raising a temperature of the vaporized material so that the vaporized material decomposes in the vicinity of the substrate, wherein said gas reacts with said decomposed precursor liquid to form a solid coating on the substrate.

17. The method of claim 16, further comprising the step of placing nonreactive, nonconductive particles in said precursor liquid for facilitating fluidization and mixing of said liquid bed.

18. The method of claim 16, wherein said heating means comprises an induction coil, said induction coil immersed in said precursor liquid.

19. The method of claim 16, wherein said heating means comprises an induction coil, said induction coil surrounding said reactor.

20. The method of claim 16, wherein said reactor comprises a non-conducting material.

21. The method of claim 16, further comprising the step of agitating said liquid bed with a stirring device in order to enhance fluidization of said liquid bed, said stirring device comprising a nonconductive material.

22. The method of claim 16, further comprising the step of recapturing a vapor rising from said precursor liquid.

23. The method of claim 16, wherein the substrate is unrestrained within said precursor liquid with respect to means for heating the substrate.

24. The method of claim 16, wherein the coating of the substrate occurs by chemical vapor deposition.

25. The method of claim 16, wherein the coating of the substrate occurs by chemical vapor infiltration.

26. The method of claim 16, further comprising the step of recirculating said precursor liquid in order to enhance fluidization of said liquid bed.

* * * * *